United States Patent
Smart et al.

(10) Patent No.: US 7,408,182 B1
(45) Date of Patent: Aug. 5, 2008

(54) SURFACE PASSIVATION OF GAN DEVICES IN EPITAXIAL GROWTH CHAMBER

(75) Inventors: Joseph Smart, Mooresville, NC (US); David Grider, Huntersville, NC (US); Shawn Gibb, Charlotte, NC (US); Brook Hosse, Huntersville, NC (US); Jeffrey Shealy, Huntersville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 149 days.

(21) Appl. No.: 11/397,279

(22) Filed: Apr. 4, 2006

Related U.S. Application Data

(62) Division of application No. 10/689,980, filed on Oct. 20, 2003, now Pat. No. 7,052,942.

(60) Provisional application No. 60/503,917, filed on Sep. 19, 2003.

(51) Int. Cl.
*H01L 29/06* (2006.01)
*H01L 29/26* (2006.01)

(52) U.S. Cl. .................. 257/13; 257/79; 257/194; 257/E29.246; 257/E33.001; 257/E33.034; 257/E21.403; 257/E21.407

(58) Field of Classification Search ........... 257/194, 257/E21.403, E21.407, E29.246, E33.001, 257/E33.034, 13, 79
See application file for complete search history.

(56) References Cited

U.S. PATENT DOCUMENTS

| | | | |
|---|---|---|---|
| 5,698,870 A | 12/1997 | Nakano et al. | |
| 5,834,326 A | 11/1998 | Miyachi et al. | |
| 5,843,590 A | 12/1998 | Miura et al. | |
| 5,874,747 A | 2/1999 | Redwing et al. | |
| 6,110,757 A | 8/2000 | Udagawa | |
| 6,384,433 B1 | 5/2002 | Barratt et al. | |
| 6,387,733 B1 | 5/2002 | Holyoak et al. | |
| 6,448,793 B1 | 9/2002 | Barratt et al. | |
| 6,455,877 B1 | 9/2002 | Ogawa et al. | |
| 6,560,452 B1 | 5/2003 | Shealy | |
| 6,633,073 B2 | 10/2003 | Rezvani et al. | |
| 6,706,576 B1 | 3/2004 | Ngo et al. | |
| 6,750,482 B2 | 6/2004 | Seaford et al. | |
| 6,802,902 B2 | 10/2004 | Beaumont et al. | |
| 6,815,722 B2 | 11/2004 | Lai et al. | |
| 6,815,730 B2 * | 11/2004 | Yamada | 257/101 |
| 2002/0031851 A1 | 3/2002 | Linthicum et al. | |
| 2002/0048302 A1 | 4/2002 | Kimura | |
| 2004/0070003 A1 | 4/2004 | Gaska et al. | |

\* cited by examiner

*Primary Examiner*—Long K Tran
(74) *Attorney, Agent, or Firm*—Withrow & Terranova, PLLC

(57) ABSTRACT

The present invention relates to passivation of a gallium nitride (GaN) structure before the GaN structure is removed from an epitaxial growth chamber. The GaN structure includes one or more structural epitaxial layers deposited on a substrate, and the passivation layer deposited on the structural epitaxial layers. In general, the passivation layer is a dielectric material deposited on the GaN structure that serves to passivate surface traps on the surface of the structural epitaxial layers. Preferably, the passivation layer is a dense, thermally deposited silicon nitride passivation layer.

14 Claims, 2 Drawing Sheets

SURFACE PASSIVATION OF GAN DEVICES IN EPITAXIAL GROWTH CHAMBER

This application is a Divisional of U.S. utility application Ser. No. 10/689,980 filed Oct. 20, 2003, now U.S. Pat. No. 7,052,942, which claims the benefit of provisional patent application Ser. No. 60/503,917, filed Sep. 19, 2003, the disclosures of which are hereby incorporated by reference in their entireties.

FIELD OF THE INVENTION

The present invention relates to surface passivation of a gallium nitride (GaN) epitaxial structures, and more particularly relates to thermally assisted deposition of silicon nitride passivation of the GaN structures while in a GaN growth chamber.

BACKGROUND OF THE INVENTION

Gallium nitride (GaN) offers substantial opportunity to enhance performance of electronic devices such as high electron mobility transistors (HEMTs) and metal-insulator-semiconductor field effect transistors (MISFETs). Epitaxial growth of GaN structures leads to phenomena associated with surface traps, which degrade performance of electronic devices, on the surface of the GaN structure. The surface traps are open bonding sites, on the surface of the GaN structure caused by an abrupt termination of the GaN crystal structure. The reactions associated with surface traps degrade the performance of electronic devices fabricated using the GaN structure by causing radio frequency (RF) dispersion and current collapse.

In order to avoid degradation of electronic devices due to the surface traps, a passivation layer may be deposited on the surface of the GaN structure. Generally, the passivation layer is a dielectric material capable of passivating, neutralizing, or filling the surface traps. However, conventional methods of passivating the GaN structure, such as plasma enhanced chemical vapor deposited (PECVD) silicon nitride, occur after the growth of the GaN structure and outside of the growth chamber used to grow the GaN structure. Therefore, the GaN structure is exposed to the atmosphere prior to fabrication of the electronic device. By exposing the GaN structure to the atmosphere, oxidation may occur on the surface of the GaN structure, thereby decreasing the effectiveness and reproducibility of the ex-situ passivation process. Therefore, there remains a need for a GaN structure having a passivation layer deposited before the GaN structure is removed from the growth chamber.

SUMMARY OF THE INVENTION

The present invention relates to passivation of a gallium nitride (GaN) structures before the GaN structure is removed from an epitaxial growth chamber. The GaN structure includes one or more structural epitaxial layers deposited on a substrate and the passivation layer deposited on the structural epitaxial layers. In general, the passivation layer is a dielectric material deposited on the GaN structure that serves to passivate surface traps on the surface of the structural epitaxial layers. Preferably, the passivation layer is a pyrolitic (thermally assisted) silicon nitride (PSN) passivation layer.

The GaN structure including the PSN passivation layer may be used to fabricate electrical devices such as a high electron mobility transistor (HEMT) or a metal-insulator-semiconductor field effect transistor (MISFET). For the HEMT, the structural epitaxial layers include a transitional layer, a GaN buffer layer, and an aluminum gallium nitride (AlGaN) Schottky layer. Optionally, the structural epitaxial layers may include a sub-buffer layer between the transitional layer and the GaN buffer layer and/or a GaN termination layer deposited on the AlGaN Schottky layer. The PSN passivation layer is etched in order to form source, gate, and drain contacts. The PSN passivation layer serves to essentially eliminate degradation of the operation of the HEMT due to phenomena such as radio frequency (RF) dispersion and current collapse by passivating the surface traps on the surface of the Schottky layer or the optional GaN termination layer. In a similar fashion, the MISFET may be fabricated from the GaN structure including the PSN passivation layer by forming the gate contact on the PSN passivation layer.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
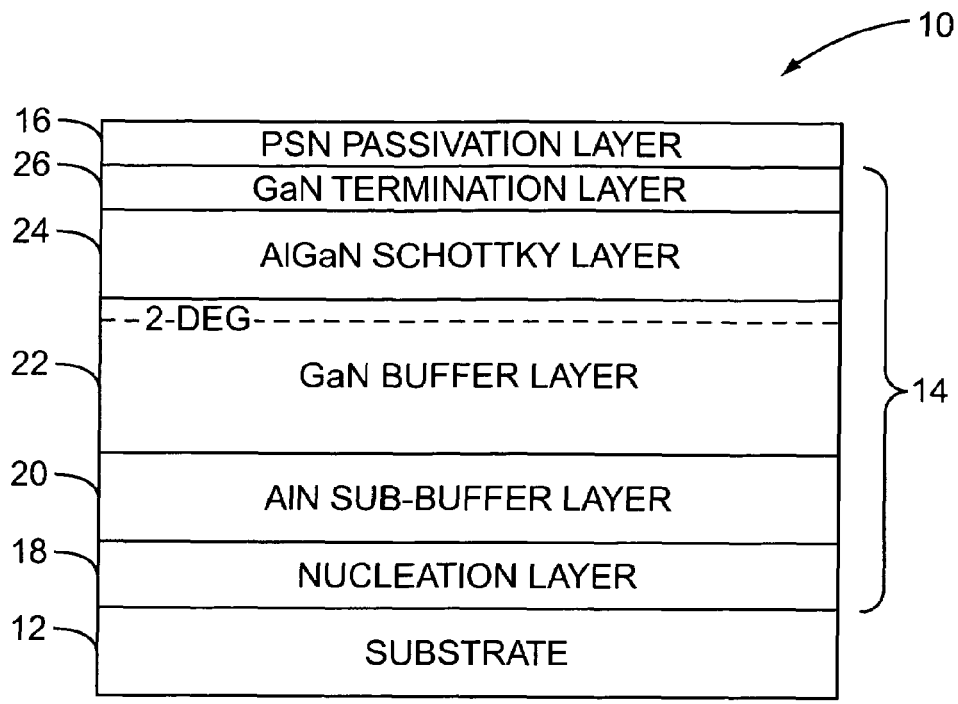
FIG. 1 illustrates a gallium nitride (GaN) structure having an in-situ pyrolitic silicon nitride (PSN) passivation layer according to one embodiment of the present invention.

FIG. 1 illustrates a gallium nitride (GaN) structure having been passivated before removal from a growth chamber (not shown) according to the present invention. The GaN structure 10 includes a substrate 12, structural epitaxial layers 14, and a (pyrolitic silicon nitride) PSN passivation layer 16. In one embodiment, the PSN passivation layer 16 is a thermally assisted silicon nitride passivation layer. The PSN passivation layer 16 is deposited on the structural epitaxial layers 14 prior to removing the GaN structure 10 from the growth chamber, thereby providing a well controlled environment for the passivation of the surface of the structural epitaxial layers 14 and avoiding exposure of the surface of the structural epitaxial layers 14 to the atmosphere. As a result of the PSN passivation layer 16, GaN electronic devices fabricated using the GaN structure 10 have improved performance and reliability.

In general, the PSN passivation layer 16 is a dielectric material that passivates the surface traps on the surface of the structural epitaxial layers 14, where the surface traps are unused bonding sites in the crystalline structure of the structural epitaxial layers 14 caused by the abrupt termination of the structural epitaxial layers 14. Due to the insulating nature of the PSN passivation layer 16, the PSN passivation layer 16 is more dense than traditional passivation layers deposited by Plasma Enhanced Chemical Vapor Deposition (PEVCD), thereby providing improved passivation of the surface traps on the surface of the structural epitaxial layers 14. Further, by being more dense than traditional passivation layers, the PSN passivation layer 16 essentially eliminates occurrences of pin-holes, which are holes extending vertically through a layer that may occur especially in thin deposited layers.

In addition, the PSN passivation layer 16 may be deposited using pyrolysis, which is a thermally activated process commonly know in the art. In general, the deposition of the PSN passivation layer 16 is a high temperature chemical vapor deposition process. Therefore, the deposition of the PSN passivation layer 16 avoids plasma-induced surface damage that may occur in the traditional PECVD passivation process.

In the illustrated embodiment, the structural epitaxial layers 14 include a nucleation (transitional) layer 18, an aluminum nitride (AlN) sub-buffer layer 20, a GaN buffer layer 22, an aluminum gallium nitride (AlGaN) Schottky layer 24, and a GaN termination layer 26. Although the AlN sub-buffer 20 and the GaN termination layer 26 are described herein as being part of the GaN structure 10, it is important to note that the AlN sub-buffer layer 20 and the GaN termination layer 26 are optional layers that improve the performance of an electronic device fabricated using the GaN structure 10 and are not necessary for the present invention. The substrate 12 may include various materials including but not limited to sapphire or silicon carbide (SiC). The nucleation layer 18 is preferably an aluminum rich layer such as but not limited to AlGaN. In addition, the structural epitaxial layers 14 may be grown in the growth chamber by various methods including Organic Metallic Vapor-Phase Epitaxy (OMVPE), Molecular Beam Epitaxy (MBE), Hydride Vapor-Phase Epitaxy (HVPE), and Physical Vapor Deposition (PVD).

When growing the GaN structure 10, the nucleation layer 18 is deposited on the substrate 12. The nucleation layer 18 operates to correct a lattice mismatch between the AlN sub-buffer layer 20 and the substrate 12. In general, a lattice mismatch is created when spacing between atoms of one layer does not match the spacing between atoms of an adjacent layer. As a result of the lattice mismatch, bonding between the atoms of the adjacent layers are weak, and the adjacent layers could crack, separate, or have a large number of crystalline defects. Therefore, the nucleation layer 18 operates to correct the lattice mismatch between the AlN sub-buffer layer 20 and the substrate 12 by creating an interface between the crystalline structure of the substrate 12 and the crystalline structure of the AlN sub-buffer 20.

After depositing the nucleation layer 18, the AlN sub-buffer layer 20 is deposited on the nucleation layer 18. Once the AlN sub-buffer layer 20 is deposited on the nucleation layer 18, the GaN buffer layer 22 is deposited on the AlN sub-buffer layer 20, and the AlGaN Schottky layer 24 is deposited on the GaN buffer layer 22. A two dimensional electron gas (2-DEG) conduction channel, which is a thin, high mobility channel, confines carriers to an interface region illustrated by a dashed line between the GaN buffer layer 22 and the AlGaN Schottky layer 24. The GaN termination layer 26 is deposited on the AlGaN Schottky layer 24 and serves as a reproducible termination layer.

The PSN passivation layer 16 is deposited on the GaN termination layer 26 after the deposition of the structural epitaxial layers 14 on the substrate 12 while the GaN structure 10 is still in the growth chamber. Preferably, the PSN passivation layer 16 is deposited on the structural epitaxial layer 14 immediately following the deposition of the structural epitaxial layers 14 on the substrate 12. As discussed above, the PSN passivation of the GaN structure 10 before removing the GaN structure 10 from the growth chamber prevents exposure of the surface of the structural epitaxial layers 14 to air before passivation. In addition, for embodiments that do not include the GaN termination layer 26, the PSN passivation layer 16 prevents oxidation of the AlGaN Schottky layer 24 when the GaN structure 10 is exposed to air.

Figure 2:
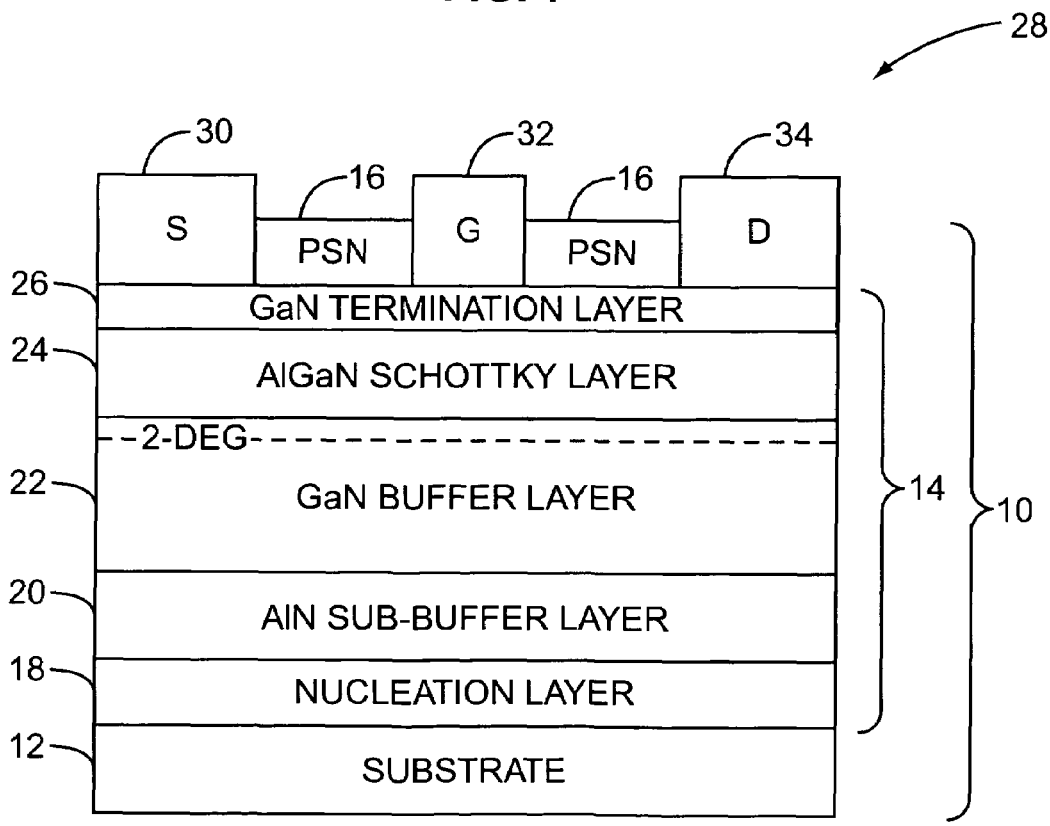
FIG. 2 illustrates a high electron mobility transistor (HEMT) having an in-situ PSN passivation layer according to one embodiment of the present invention.

FIG. 2 illustrates a high electron mobility transistor (HEMT) 28 fabricated using the GaN structure 10 (FIG. 1). The PSN passivation layer 16 passivates the surface traps on the surface of the structural epitaxial layers 14 in regions between a source contact 30 and a gate contact 32 and between the gate contact 32 and a drain contact 34. The PSN passivation layer 16 essentially eliminates degradation of operation of the HEMT 28 due to phenomena associated with the surface traps, such as radio frequency (RF) dispersion and current collapse. For example, current collapsing occurs when a large bias voltage is applied between the source contact 30 and the drain contact 34.

As discussed above, the optional GaN termination layer 26 is a reproducible termination layer and is not necessary for the present invention. In the preferred embodiment, the GaN termination layer 26 is approximately 1-2 nanometers thick. Therefore, electrons can easily tunnel through the GaN termination layer 26. As a result, the GaN termination layer 26 does not increase the Schottky barrier height between the gate contact 32 and the AlGaN Schottky layer 24, where the Schottky barrier height defines a potential energy barrier encountered by electrons at the interface of the gate contact 32 and the AlGaN Schottky layer 24. Further, the GaN termination layer 26 does not affect the formation of the source and drain contacts 30 and 34.

The AlN sub-buffer layer 20 improves the performance of the HEMT 28 by preventing injection of electrons into the nucleation layer 18 and the substrate 12 during high-power operation of the HEMT 28. As a result, a source-drain breakdown voltage for the HEMT 28 improves from approximately 20 volts to more than 100 volts. Therefore, the HEMT 28 may be used in a high power GaN amplifier (not shown). As discussed above, the AlN sub-buffer layer 20 is optional and is not necessary for the present invention.

During fabrication of the HEMT 28, the PSN passivation layer 16 is etched in a first region to connect the source contact 30, in a second region to connect the gate contact 32, and in a third region to connect the drain contact 34 to the GaN termination layer 26. In an alternative embodiment that does not include the GaN termination layer 26, the contacts 30, 32, and 34 are formed on the AlGaN Schottky layer 24. The gate contact 32 is a metallic material such as but not limited to nickel gold. The source and drain contacts 30 and 34, respectively, are ohmic contacts. Further, the source and drain contacts 30 and 34, respectively, are each a metallic material such as but not limited to titanium gold, titanium aluminum, or titanium.

For the gate contact 32, the PSN passivation layer 16 is preferably etched using a wet chemical etch, in order to avoid plasma-induced surface damage that would adversely affect operation of the gate contact 32 and the HEMT 28. Alternatively, the gate opening can also be made by dry etching methods with a fluorine or chlorine based etch. For the source contact 30 and the drain contact 34, the PSN passivation layer 16 may be etched using either wet or dry chemical etching, such as but not limited to fluorine-based reactive ion etching. Further, plasma induced surface damage may improve ohmic contact of the source contact 30 and the drain contact 34 to the structural epitaxial layers 14.

Figure 3:
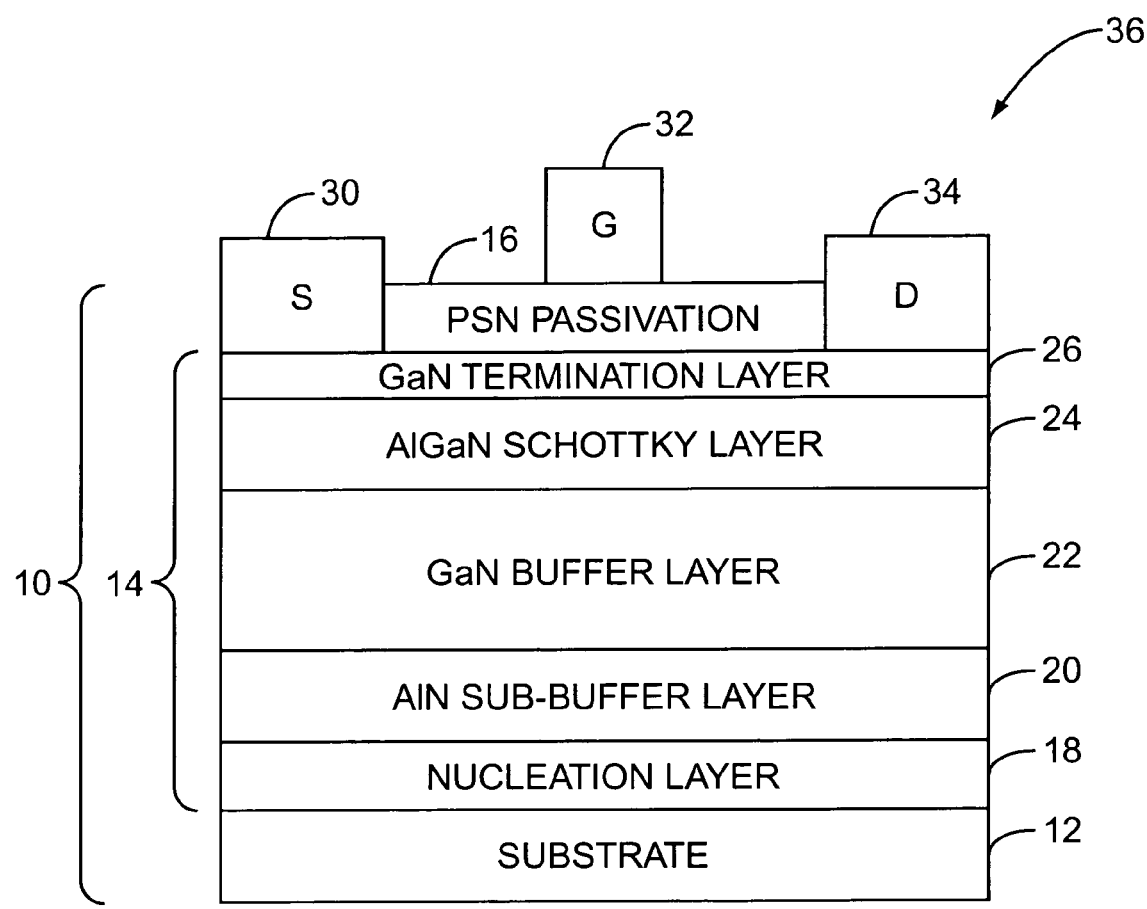
FIG. 3 illustrates a metal-insulator-semiconductor field effect transistor (MISFET) having an in-situ PSN passivation layer according to one embodiment of the present invention.

FIG. 3 illustrates an embodiment of the present invention that is similar to the HEMT 28 in FIG. 2, and in particular FIG. 3 illustrates a metal-insulator-semiconductor field effect transistor (MISFET) 36. In this embodiment, the MISFET 36 is fabricated by forming the gate contact 32 on the PSN passivation layer 16 and the source and drain contacts 30 and 34 on the GaN termination layer 26. The details of the MISFET 36 with respect to the present invention are similar to the details of the HEMT 28 in FIG. 2. In general, the PSN passivation layer 16 serves to passivate the surface traps on the surface of the structural epitaxial layers 14, thereby preventing device degradation due to phenomena associated with the surface traps such as but not limited to RF dispersion and current collapse.

Those skilled in the art will recognize improvements and modifications to the preferred embodiments of the present invention. All such improvements and modifications are considered within the scope of the concepts disclosed herein and the claims that follow.

What is claimed is:

1. A gallium nitride (GaN) epitaxial structure manufactured in a growth chamber by a process comprising:
   a) depositing one or more structural epitaxial layers on a substrate, the one or more structural epitaxial layers including a GaN buffer layer in the growth chamber; and
   b) depositing a passivation layer on the one or more structural epitaxial layers, thereby forming a GaN structure that is passivated before the GaN structure is removed from the growth chamber, wherein the passivation layer comprises a pyrolitic silicon nitride.

2. The structure of claim 1 wherein the passivation layer is a thermally assisted silicon nitride passivation layer.

3. The structure of claim 1 wherein the process further comprises:
   a) forming a source contact on the one or more structural epitaxial layers in an etched source region of the passivation layer;
   b) forming a gate contact on the one or more structural epitaxial layers in an etched gate region of the passivation layer; and
   c) forming a drain contact on the one or more structural epitaxial layers in an etched drain region of the passivation layer,
   thereby forming a high electron mobility transistor.

4. The structure of claim 1 wherein the process further comprises:
   a) forming a source contact on the one or more structural epitaxial layers in an etched source region of the passivation layer;
   b) forming a gate contact on the passivation layer; and
   c) forming a drain contact on the one or more structural epitaxial layers in an etched drain region of the passivation layer,
   thereby forming a metal-insulator-semiconductor field effect transistor.

5. The structure of claim 1 wherein the passivation layer is deposited using pyrolysis.

6. The structure of claim 1 wherein the depositing the one or more structural epitaxial layers comprises depositing a transitional layer on the substrate.

7. The structure of claim 6 wherein the depositing the one or more structural epitaxial layers further comprises depositing the GaN buffer layer on the transitional layer.

8. The structure of claim 7 wherein the depositing the one or more structural epitaxial layers further comprises depositing an aluminum gallium nitride (AlGaN) Schottky layer on the GaN buffer layer.

9. The structure of claim 8 wherein the depositing the one or more structural epitaxial layers further comprises depositing a GaN termination layer on the AlGaN Schottky layer.

10. The structure of claim 6 wherein the depositing the one or more structural epitaxial layers further comprises depositing a sub-buffer layer on the transitional layer.

11. The structure of claim 10 wherein the sub-buffer layer is essentially aluminum nitride.

12. The structure of claim 10 wherein the depositing the one or more structural epitaxial layers further comprises depositing the GaN buffer layer on the sub-buffer layer.

13. The structure of claim 12 wherein the depositing the one or more structural epitaxial layers further comprises depositing a aluminum gallium nitride (AlGaN) Schottky layer on the GaN buffer layer.

14. The structure of claim 13 wherein the depositing the one or more structural epitaxial layers further comprises depositing a GaN termination layer on the AlGaN Schottky layer.

* * * * *